United States Patent [19]
Philbrick et al.

[11] Patent Number: 6,037,655
[45] Date of Patent: Mar. 14, 2000

[54] LINEAR IMAGE SENSOR PACKAGE ASSEMBLY

[75] Inventors: Robert H. Philbrick; Antonio S. Ciccarelli, both of Rochester, N.Y.

[73] Assignee: Eastman Kodak Company, Rochester, N.Y.

[21] Appl. No.: 09/005,611

[22] Filed: Jan. 12, 1998

[51] Int. Cl.[7] .............................. H01L 23/02; H01L 23/12
[52] U.S. Cl. .......................... 257/680; 257/678; 257/674; 257/704
[58] Field of Search .................................. 257/680, 678, 257/684, 704

[56] References Cited

U.S. PATENT DOCUMENTS

| | | | |
|---|---|---|---|
| 4,326,214 | 4/1982 | Trueblood ............................... | 257/680 |
| 4,760,440 | 7/1988 | Bigler et al. ............................ | 257/680 |
| 4,895,291 | 1/1990 | Ozimek et al. ......................... | 228/121 |
| 5,043,139 | 8/1991 | Carnall, Jr. et al. .................... | 420/526 |
| 5,289,002 | 2/1994 | Tarn ....................................... | 250/239 |
| 5,296,724 | 3/1994 | Ogata et al. ............................ | 257/98 |
| 5,299,275 | 3/1994 | Jackson et al. ......................... | 385/116 |
| 5,433,911 | 7/1995 | Ozimek et al. ......................... | 264/261 |

FOREIGN PATENT DOCUMENTS

| | | | |
|---|---|---|---|
| 55-53447 | 4/1980 | Japan ..................................... | 257/680 |
| 57-32656 | 2/1982 | Japan ..................................... | 257/680 |
| 59-27548 | 2/1984 | Japan ..................................... | 257/680 |
| 60-81844 | 5/1985 | Japan ..................................... | 257/680 |

*Primary Examiner*—Mahshid Saadat
*Assistant Examiner*—Jhihan B Clark
*Attorney, Agent, or Firm*—James D. Leimbach

[57] ABSTRACT

Packaging of high resolution linear solid state image sensors can result in a significant cost savings over conventional packaging processes, while adding several features. Cost reduction is accomplished by drastically reducing the cover glass size, eliminating the need for rounded corners as well as need for an epoxy ring on the cover glass, and integrating a wire bond light shield into the IC package. Additional cost savings are realized by eliminating the thermal cure cycle presently required to attach the cover glass, a process which can take several hours to completed. The invention replaces the conventional IC package with a two piece assembly. The bottom piece is a low profile plastic or ceramic IC package and the top piece is an inexpensive molded piece which serves as a cap with an integrated light shield aperture and cover glass holder.

14 Claims, 4 Drawing Sheets

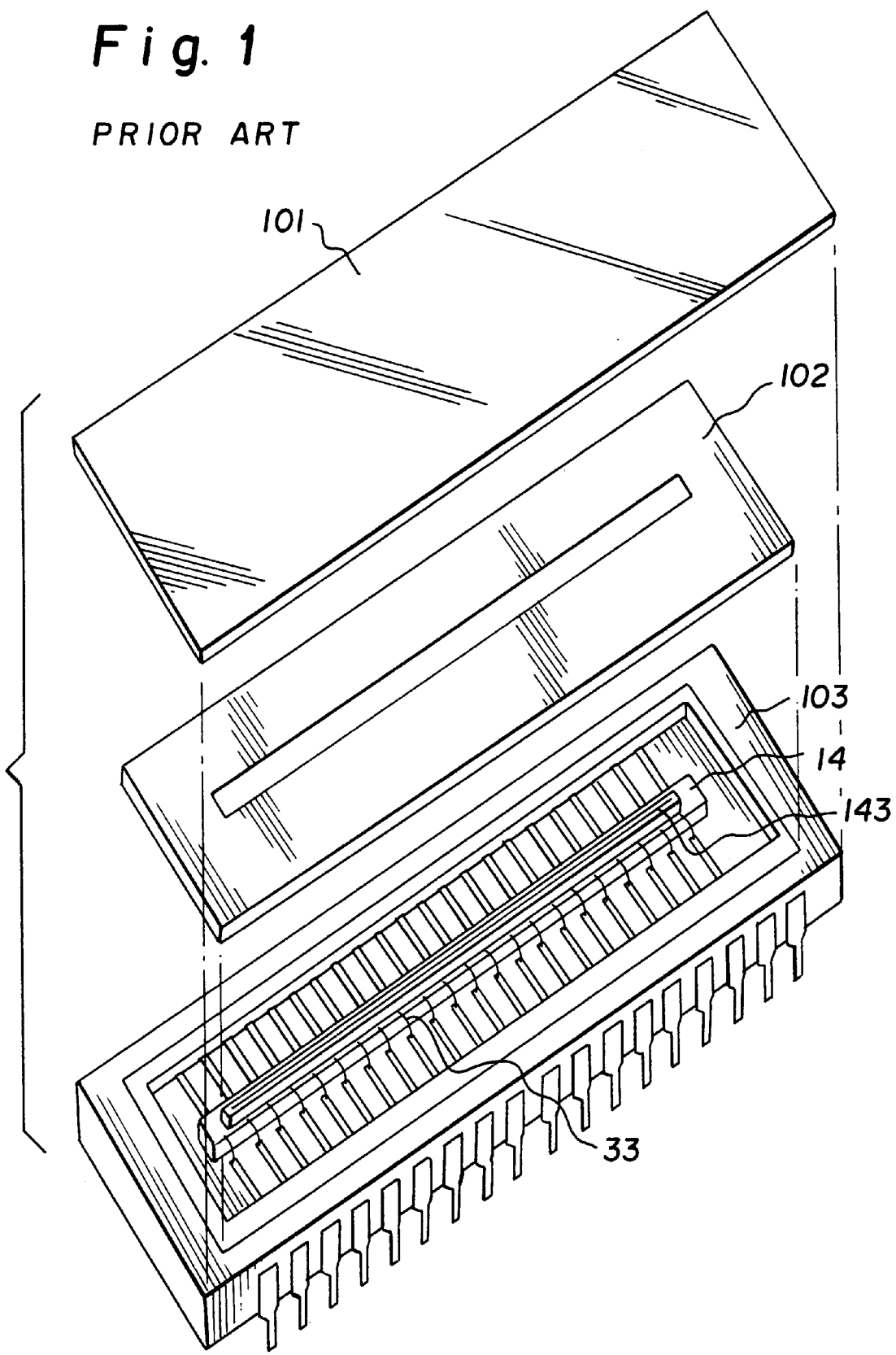

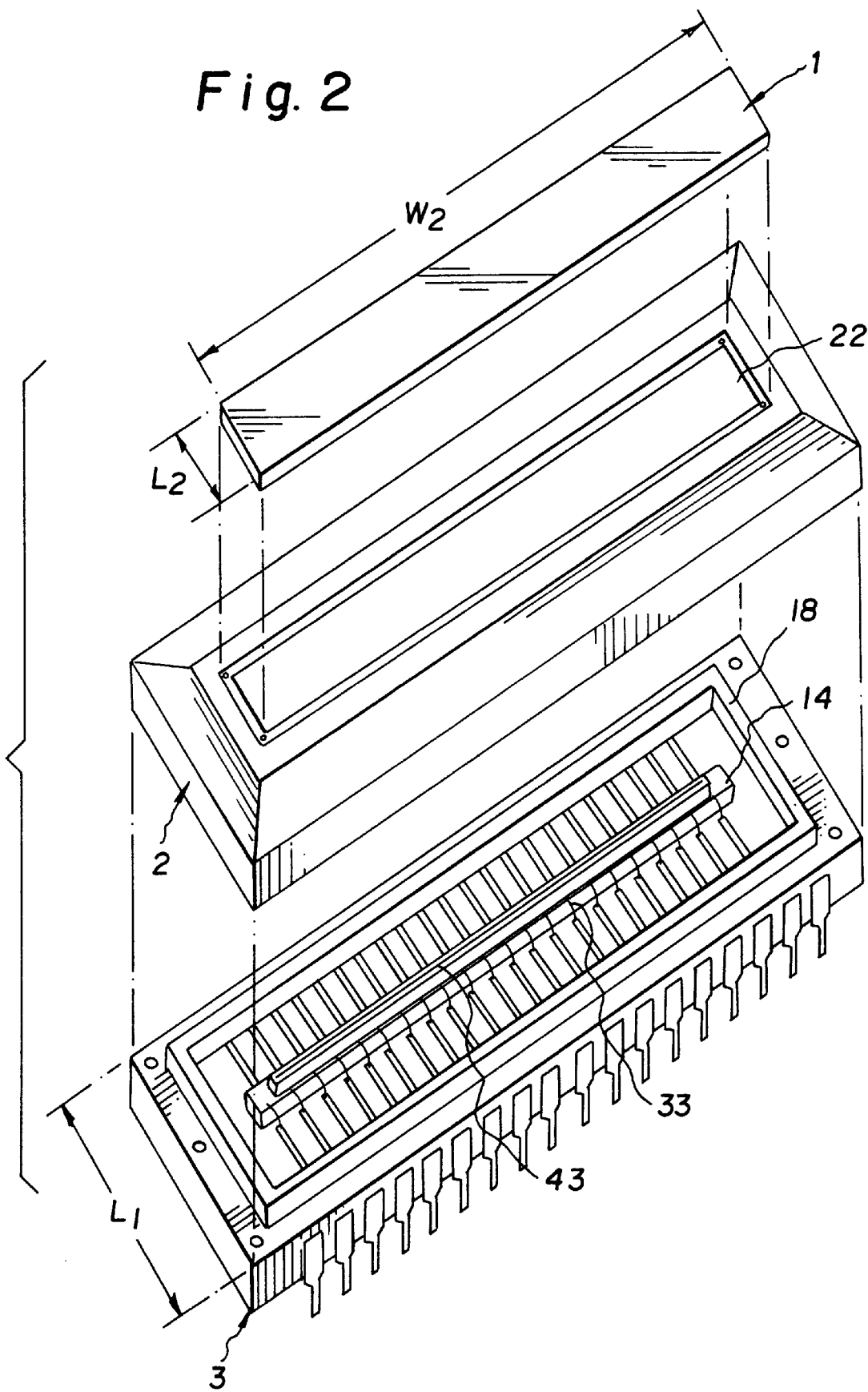

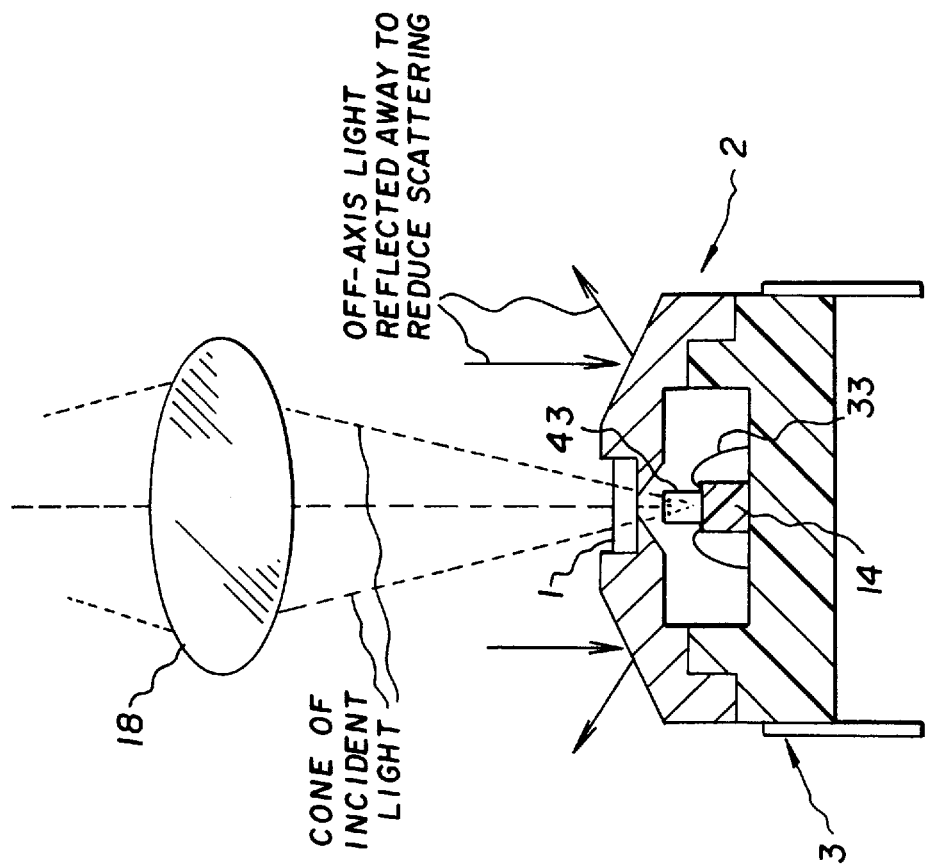
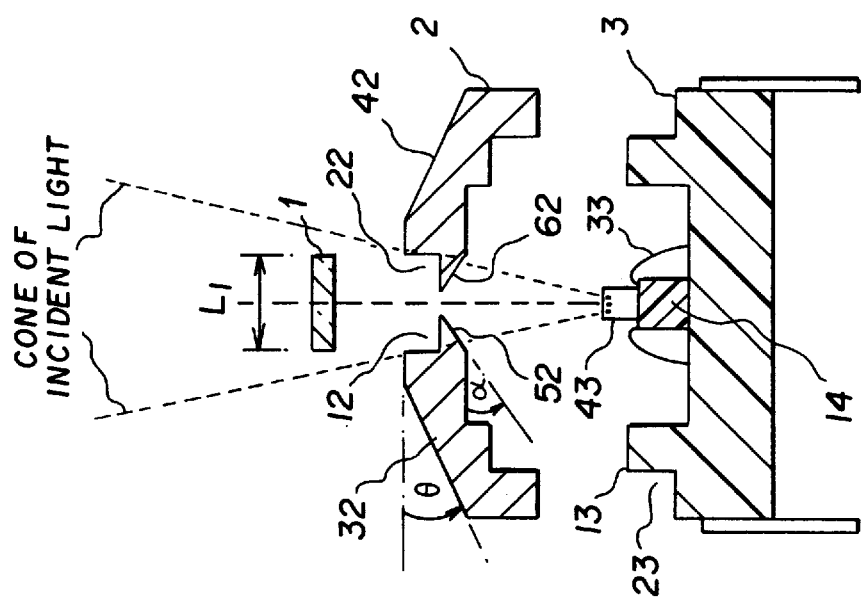

LINEAR IMAGE SENSOR PACKAGE ASSEMBLY

FIELD OF THE INVENTION

The invention relates generally to the field of packaging image sensors and in particular to the packaging of high resolution, linear image sensors.

BACKGROUND OF THE INVENTION

The packaging process for high resolution linear image sensors starts with a single piece of ceramic or plastic IC package onto which an image sensor is mechanically attached and wire bonded. Optionally, a dichroic filter is attached to the imager surface, then an external wire bond light shields is attached to the IC package. The process is completed by the attachment of a cover glass with dimensions approximately equal to the IC package length and width, as depicted in FIG. 1.

The cover glass used for image sensors must be of very high optical quality and have an anti-reflection coating due to the close proximity to the image sensor where it resides, hence it is expensive. However, the actual area of glass which lies in the optical path ($A_a$) is only a small fraction of the total area ($A_t$). Ideally, the cover glass should be only slightly larger in area than $A_a$ in order to minimize the artifact. A single piece IC package capable of handling the smaller area cover glass would make it impossible to insert the image sensor die and wire bond it to the IC package lead frame. The cover glass is attached to the outer package surface, or sometimes a recessed surface, by activating a pre-deposited epoxy located around the perimeter of the cover glass through the application of elevated temperatures, a process which can take several hours to complete. If the cover glass is attached to the outer surface, the corners of the glass must be polished (e.g. rounded) to prevent cutting of persons involved in the assembly process. The process used to manufacture cover glass with this pre-deposited epoxy ring adds considerable cost to the cover glass—more than doubling the cost in come cases. Furthermore, the epoxy has a storage life of approximately 1 year, and glass not used by the end of this period must be discarded.

The external light shield is first machined or molded to form the aperture opening and then plated with an optically opaque material to absorb off axis and scattered light. The cost to manufacture these light shields is relatively low, but still may account for several percent of the overall packaging price tag. Like the cover glass, the total light shield area is slightly smaller than the overall IC package area, again adding costs to the packaging process. A further drawback of using an unnecessarily large area light shield (and cover glass) is that stray, or off-axis light can reflect off the outer surface of the light shield (or cover glass) and into the imaging plane, resulting in a degraded imager output. Therefore, minimizing the total area of the light shield and cover glass which is parallel to the imaging optics is a desirable goal.

The image sensor package assembly and assembly process described above has a number of drawbacks which the invention described herein addresses.

SUMMARY OF THE INVENTION

This invention pertains to the packaging of high resolution linear solid state image sensors, and can result in a significant cost savings over conventional packaging processes, while adding several features. The cost reduction is accomplished by drastically reducing the cover glass size, eliminating the epoxy ring on the cover glass, and integrating a wire bond light shield into the IC package. Additional cost savings are realized by eliminating the thermal cure cycle presently required to attach the cover glass, a process which can take several hours to be completed.

The invention replaces the conventional IC package with a two piece assembly. The bottom piece is a low profile plastic or ceramic IC package and the top piece is an inexpensive molded piece which serves as a cap with an integrated light shield aperture and cover glass holder.

The present invention is directed to overcoming one or more of the problems set forth above. Briefly summarized, according to one aspect of the present invention, a package for linear image sensors comprising:

a base having a first length and a first width;

electrical interconnect means formed on the base for interfacing a solid state image sensing device to external circuitry;

a cap formed from an opaque material having an outside surface and an inside surface, the cap formed such that it mates with the base;

a recessed area within the cap and an aperture being formed within the recessed area, the recessed area having a second length that approaches the first length and a second width that is less than half the first width; and a cover glass that fits within the recessed area.

These and other aspects, objects, features, and advantages of the present invention will be more clearly understood and appreciated from a review of the following detailed description of the preferred embodiments and appended claims, and by reference to the accompanying drawings.

Advantageous Effect Of The Invention

Use of the image sensor IC package assembly described herein can result in a significant cost savings over existing image sensor packaging processes, while including additional features and reducing the overall time for assembly.

The present invention has the advantages of: (1) lowering the overall cost of packaging a high resolution linear image sensor; (2) integrating light shield to reduce stray reflection off of wire bonds; (3) reducing the size (and cost) of cover glass, elimination of pre-deposited epoxy ring on cover glass, and the elimination of the need for rounded edges in the cover glass; (4) reducing the degrading effects of reflections off surface of imager as a result of a beveled IC package; (5) simplify the IC assembly process (i.e. die, package, light shield, cover glass, epoxy); (6) reducing the time necessary to assemble imager, a result of the elimination of epoxy ring and the use of UV cured epoxy for cover glass attachment and 'instant' epoxy for joining the cap to the base package; and (7) integrating bevels on a light shield to reduce optical crosstalk.

BRIEF DESCRIPTION OF THE DRAWINGS

FIG. 1 is a diagram illustrating a typical packaging arrangement for a linear sensor as used in the prior art;

FIG. 2 is a diagram illustrating the packaging arrangement as envisioned by the present invention;

FIG. 3 is a cross sectional diagram illustrating the various pieces used in the packaging arrangement of FIG. 2;

FIG. 4 is a cross sectional diagram of FIG. 2;

DETAILED DESCRIPTION OF THE INVENTION

Figure 5:
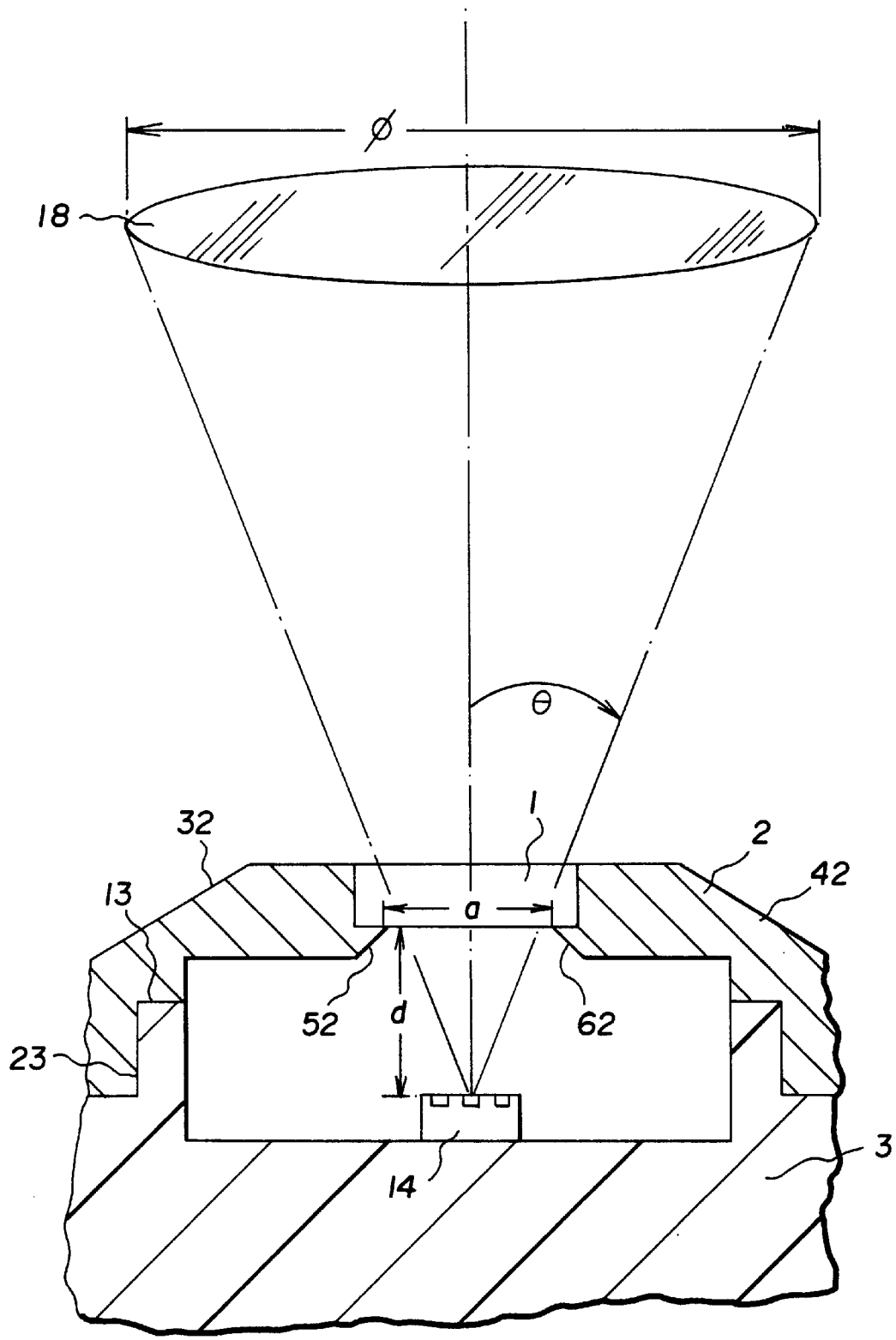
FIG. 5 is a cross sectional diagram illustrating the various angles and distances envisioned by the present invention.

It has been discovered that the packaging of high resolution linear solid state image sensors can be improved to achieve a significant cost savings over conventional packaging processes, while adding several features that enhance the performance of the linear image sensor enclosed within the package. The cost reduction is accomplished in large part by drastically reducing the size of the cover glass used in the package. The glass material used in making the cover glass is a high quality optical glass that is very expensive, approximately $20.00 for each final finished product. By substantially reducing the amount of this high quality glass that is used by greatly reducing the size of the cover glass, a significant portion of the cost for each final assembly is eliminated.

Referring to FIG. 1, conventional assemblies as shown in FIG. 1 require an epoxy ring around the cover glass 101 to adhere the cover glass to the top of the base 103. Referring now to FIG. 2 by eliminating the epoxy ring on the cover glass 1, and integrating a light shield into the cap 2 the cost of the package can be further reduced. Additional cost savings are realized by eliminating the thermal cure cycle presently required to attach the cover glass, a process which can take several hours to complete.

This invention, illustrated in FIGS. 2, 3 and 4, replaces the conventional linear imager package assembly shown in FIG. 1. Note, for simplicity the drawings illustrated in FIGS. 2–4 show only the details necessary to communicate the present invention, and it should be understood that additional features will exist on the enclosed sensors and package assemblies that are not shown because they are not necessary parts of the invention. Base 3, as seen in FIGS. 2–4, is manufactured in any manner similar to those prior art IC packages with the requirement that it mate properly with cap 2 and has reduced mass compared to conventional IC packages. Base 3 within the preferred embodiment as illustrated in FIGS. 2–4, has a top surface 13 that is easily accessed by automated die placement and wire bonding robotics. The indentations 23 shown on base 3 are used to hold deposited epoxy, which can be dispensed by either an operator or automated machinery. This epoxy can be a thermally cured type or preferably an 'instant' curing type. The simpler design of base 3 results in a less expensive part, due to reduced tooling charges and the reduced material usage.

Still referring to FIGS. 2–4, cap 2 is a molded, single piece of inexpensive material (e.g., plastic) which consists of integrated light shield aperture 12 and cover glass holder 22. The cap 2 is attached to base 3 after the die 14 is attached to pads (not shown) that are contained on the base 3, typically via wire bonding 33, and, optionally, dichroic filter 43 attachment is completed. While the preferred embodiment envisions wire bonding being used to attach the die to the bond pads, obvious variations of this means for interfacing the sensor to external circuitry will be readily apparent to those skilled in the art. Among these are ball bonds wherein small conduits are provided through the semiconductor sensor itself. These conduits have conductive material inside that mates with electrically conductive pads on the IC package either directly or through the use of spherically shaped electrically conductive balls. While the preferred embodiment envisions employing wirebonding, the use of ball bonds have advantages in reduced metal that needs to be driven by output amplifiers resulting in a reduced power requirements for the buffer/amplifies on chip.

Returning to the preferred embodiment, cap 2 is mated with the base 3 and secured by the application of quick cure epoxy. The recessed area within cap 2 that defines the cover glass holder 22 where the cover glass 1 will reside is considerably smaller than the base dimensions, as indicated by $L_1$ and $L_2$ in FIG. 2–3. Other features of the cap 2 include the beveled edges 32, 42 located on both sides of near recessed areas 32, 42 defining cover glass holder 22 (see the angle $\theta$ in FIG. 3) and on the underside of the light shield aperture (see the angle $\alpha$ in FIG. 3). In typical imaging applications, bevel edges 32, 42 reflect off-axis or scattered light away from the main optical axis, thereby minimizing the degrading effects these undesirable components may cause. Additionally, interior bevels 52, 62 are contained on the inside surface of cap 2 that faces base 3 in the final assembly. The interior bevels 52, 62 prevent light that has entered through the cover glass 1 and reflects off the sensor from again reflecting off the inside of cap 2.

It is envisioned that cap 2 be fabricated using injection molding techniques, which require tooling costs, however these tooling costs can be amortized over the cost of thousands of imagers expected to be sold, and considering the very inexpensive unit cost to manufacture cap 2, the overall cost per cap 2 is expected to be a small percentage of the total package cost (new design included).

Cover glass 1, is a piece of optical quality cover glass with length and width dimensions significantly less than those of the base 3. cover glass 1 requires no rounding of corners or pre-deposited epoxy. The cover glass 1 is attached to cap 2 by depositing drops of UV curable epoxy in the appropriate indentations on the cap, and then pressing the cover glass 1 in place, as indicated in FIG. 2. Once the glass is in place, the epoxy is cured by application of a high intensity UV light source, a process which takes approximately a minute to complete. The smaller area of the cover glass, combined with the elimination of the rounded corners and pre-deposited epoxy are expected to reduce the per unit cost of cover glass 1 by approximately 70%.

Full implementation of the above mentioned invention is expected to reduce the material cost of packaging a high resolution linear imager from 50% to 70%, while simplifying the assembly process, reducing the time required to assemble a unit, and adding features desirable to systems designers.

While the present invention is most applicable to linear imager technology, area imagers could also make use of the integrated wire bond light shield concept, to reduce cover glass area, and reduce optical glare.

PARTS LIST 1 cover glass
2 cap
3 base
12 light shield aperture
13 top surface
14 die
22 cover glass holder
23 indentations
32 beveled edge
33 wire bonding
42 beveled edge
43 dichroic filter
52 bevel 62 bevel
101 cover glass
102 light shield
103 base

What is claimed is:

1. A package for linear image sensors comprising:
   a base having a first length and a first width;
   means for interfacing a solid state image sensing device to external circuitry formed on the base;
   a cap formed from an opaque material having an outside surface having proportions essentially equal to the first width and the first length and an inside surface, the cap formed such that it mates with the base;
   a recessed area within the cap and an aperture being formed within the recessed area, the recessed area having a second length that is less than the first length and a second width that is less than half the first width, the recessed area being formed essentially centered within the cap; and
   a cover glass that fits within the recessed area.

2. The package of claim 1 further comprising a pair of beveled regions formed on the outside surface of the cap such that each of the beveled regions progresses toward the base.

3. The package of claim 1 further comprising a pair of beveled regions formed on the inside surface of the cap beginning at the aperture opening and progressing toward the base when the cap is attached to the base.

4. The package of claim 1 wherein the cover glass has a width that is greater than $$a = 2 * d * \tan \theta$$

where a is the aperture width and d is the distance from the surface of the image sensor to the bottom of the cover glass, and less than one half the width of the base and θ is the incident cone half angle associated with the imaging optics.

5. The package of claim 1 wherein the cover glass has a width that is at least 2 millimeters and no greater than one half the width of the base.

6. A method of packaging linear image sensors comprising the steps of:
   providing a base having a first length and a first width, the base having means for interfacing a solid state image sensing device to external circuitry formed on the base;
   forming a cap formed from an opaque material having an outside surface having proportions essentially equal to the first width and the first length and an inside surface such that the cap mates with the base;
   creating a recessed area within the cap and an aperture being formed within the recessed area, the recessed area having a second length that is less than the first length and a second width that is less than half the first width, the recessed area being formed essentially centered within the cap; and
   placing a cover glass that fits within the recessed area.

7. The method of claim 6 wherein the step of forming further comprises forming a pair of beveled regions formed on the outside surface of the cap such that each of the beveled regions progresses toward the base.

8. The method of claim 6 wherein the step of forming further comprises forming a pair of beveled regions on the inside surface of the cap beginning at the aperture opening and progressing toward the base when the cap is attached to the base.

9. The method of claim 6 wherein the step of creating further comprises creating a recessed area to accommodate a cover glass that has a width that is at least 2 millimeters and no greater than one half the width of the base.

10. A package for a linear solid state image sensor having a base with a first width and a first length, means for interfacing the sensor to external circuitry, and a cap that rests upon the base, the improvement comprising: the cap being formed of an opaque material having a predetermined aperture in the cap creating a light shield formed as an integral part of the cap and wherein the cap has a recessed area surrounding the aperture that has a second width that is less than half the width of the base and holds a cover glass within the recessed area.

11. The package of claim 10 wherein the cap has an outside surface that faces away from the base containing a pair of beveled regions that progress toward the base from near the recessed area.

12. The package of claim 10 wherein the cap has an inside surface that faces towards the base having a pair of beveled regions that progress toward the base from the aperture area.

13. The package of claim 10 wherein the cover glass has a width that is greater than $$a = 2d \tan \theta$$

where a is the aperture width and d is the distance form the surface of the image sensor to the bottom of the cover glass, and no greater than one half the width of the base and θ is the incident cone half angle associated with the imaging optics.

14. The package of claim 10 wherein the cover glass has a width that is at least 2 millimeters and no greater than one half the width of the base.

* * * * *